United States Patent
Chang et al.

(10) Patent No.: US 12,300,603 B2
(45) Date of Patent: May 13, 2025

(54) MODIFIED FUSE STRUCTURE AND METHOD OF USE

(71) Applicant: TAIWAN SEMICONDUCTOR MANUFACTURING COMPANY, LTD., Hsinchu (TW)

(72) Inventors: Meng-Sheng Chang, Hsinchu (TW); Chien-Ying Chen, Hsinchu (TW); Yao-Jen Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/524,621

(22) Filed: Nov. 30, 2023

(65) Prior Publication Data

US 2024/0096789 A1 Mar. 21, 2024

Related U.S. Application Data

(63) Continuation of application No. 17/192,265, filed on Mar. 4, 2021, now Pat. No. 11,854,968.

(51) Int. Cl.
*H01L 23/525* (2006.01)
*H01L 21/768* (2006.01)
*H10B 20/25* (2023.01)

(52) U.S. Cl.
CPC .... *H01L 23/5252* (2013.01); *H01L 21/76892* (2013.01); *H10B 20/25* (2023.02)

(58) Field of Classification Search
CPC .......... H01L 23/5252; H01L 21/76892; H01L 27/0207; H10B 20/25; G11C 17/16; G11C 17/18; G11C 8/08; G11C 7/12
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 10,777,288 B2 * | 9/2020 | Kurjanowicz | H01L 23/5252 |
| 2008/0042235 A1 | 2/2008 | Kodama | |
| 2014/0040838 A1 | 2/2014 | Liu et al. | |
| 2015/0278429 A1 | 10/2015 | Chang | |
| 2016/0141295 A1 * | 5/2016 | Wu | G11C 17/18 257/50 |
| 2016/0148705 A1 | 5/2016 | Lee et al. | |

* cited by examiner

*Primary Examiner* — David Vu
(74) *Attorney, Agent, or Firm* — Hauptman Ham, LLP

(57) ABSTRACT

An antifuse structure and IC devices incorporating such antifuse structures in which the antifuse structure includes an dielectric antifuse structure formed on an active area having a first dielectric antifuse electrode, a second dielectric antifuse electrode extending parallel to the first dielectric antifuse electrode, a first dielectric composition between the first dielectric antifuse electrode and the second dielectric antifuse electrode, and a first programming transistor electrically connected to a first voltage supply wherein, during a programming operation a programming voltage is selectively applied to certain of the dielectric antifuse structures to form a resistive direct electrical connection between the first dielectric antifuse electrode and the second dielectric antifuse electrode.

20 Claims, 11 Drawing Sheets

PROGRAMMING MODE
CURRENT ($I_{prog}$)
Initial (0 μA)
Fused (>0 μA)

READING MODE
READ 0
($I_{read} = 0$ μA)

READING MODE
READ 1
($I_{read} = >0$ μA)

MODIFIED FUSE STRUCTURE AND METHOD OF USE

PRIORITY CLAIM

This application is a continuation of U.S. patent application Ser. No. 17/192,265, filed Mar. 4, 2021, now U.S. Pat. No. 11,854,968, issued Dec. 26, 2023, which is incorporated herein by reference in its entirety.

BACKGROUND

In the semiconductor industry, fuse elements are used in integrated circuit (IC) devices for a variety of purposes including, for example, improving manufacturing yield and/or customizing generic programmable IC devices. For example, by isolating a defective circuit on an IC device or replacing the defective circuit with a redundant circuit provided on the same IC device, manufacturing yields can be increased. Conversely, activating or deactivating certain of the functional elements provided on a generic programmable IC device design defines a customized IC device.

Because memory devices comprise large arrays of memory cells, the IC device designs include a number of memory cells that are activated or deactivated using fuses (for cutting an electrical connection) and/or antifuses (for establishing an electrical connection) in order to replace defective memory cells with corresponding and fully functional replacement memory cells. Replacing the defective memory cells increases the number of functional IC devices and, correspondingly, increases the overall manufacturing yield. Similarly, generic IC device designs are customized by activating and/or deactivating various circuit elements using fuses and/or antifuses to produce programmed IC devices having a desired functionality.

Some One-Time-Programmable (OTP) devices, e.g., IC memory devices, use metal fuses in which portions of a metal pattern are "blown" by applying current beyond that which the fuse element is able to handle, thereby severing an existing electrical connection and creating an "open" circuit that prevents electrical connection to the associated functional elements. Other OTP memory devices, however, use gate oxide fuses in which gate oxide structures comprise the programming elements that are "blown" by applying excess voltage, thereby causing gate oxide breakdown.

Whether the programming devices use metal fuses and/or gate oxide antifuses, however, the programming process typically involves applying high voltage(s) in order to achieve the desired programming (e.g., when using gate oxide antifuses) or applying high currents (when using metal fuses). Such high voltages or high currents are taken into consideration during the design phase to ensure that the high voltage and/or high current used during the programming operation does not damage other circuitry on the IC device. Additional considerations include, for example, the complexity and the cost of fabricating the IC device and the area of the IC device devoted to the programming circuit(s).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
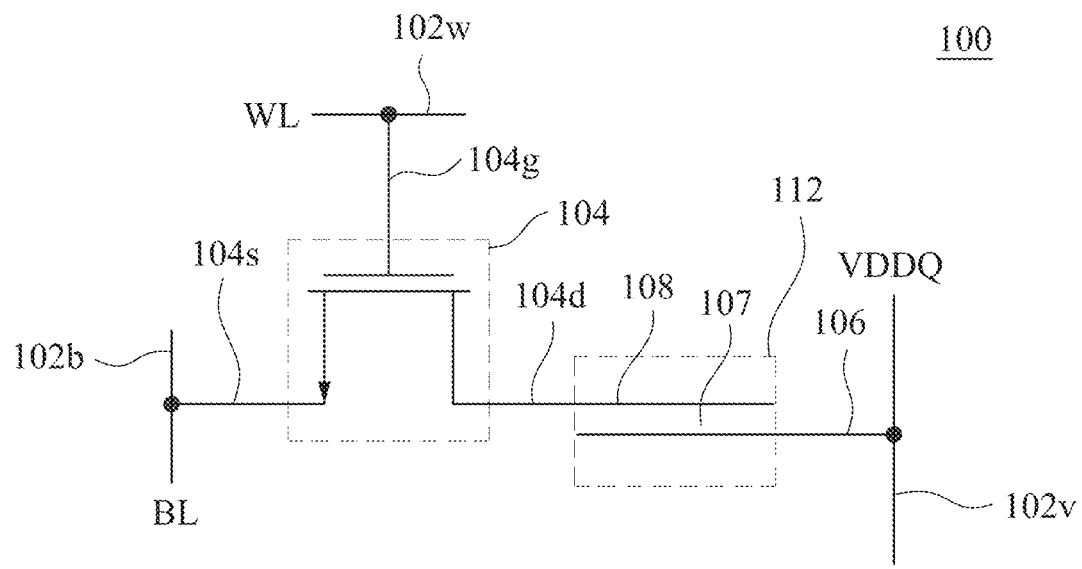
FIG. 1A is a schematic view of an antifuse structure according to some embodiments and FIG. 1B is a schematic view of the antifuse structure of FIG. 1A after a programming operation.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, and the like, are described below to simplify the present disclosure.

These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to electrical fuses (fuses, efuses, and/or antifuses) and, particularly, to antifuse designs and associated methods that can be utilized for programming IC devices and, more particularly, to IC device designs incorporating antifuse structures and methods for use OTP operations in which an applied programming voltage degrades a dielectric material to establish an electrical connection between two adjacent conductor structures.

As used herein, the term "dielectric antifuse" refers to an antifuse structure which, in an as-manufactured condition, defines a capacitor in which the electrodes include a portion of a gate conductor structure (MG) formed over the gate oxide and an adjacent and opposing portion of a source/drain contact structure (MD) formed over the S/D regions in which an interlayer dielectric (ILD) separating the portion of the gate conductor structure and the source/drain contact structure acts as the dielectric to define the capacitor. The antifuse structure is also alternatively referenced as an "mdfuse" or "MDfuse" to reflect the utilization of the source/drain contact structure as one of the antifuse electrodes and the corresponding use of the ILD as the dielectric. During a programming operation, if a particular dielectric antifuse is to be activated in order to connect the associated circuitry, a voltage, e.g., $VDDQ_P$, is applied across the gate conductor structure and adjacent source/drain conductor structure plates, with the value or magnitude of $VDDQ_P$ being sufficient to breakdown or degrade the intervening interlayer dielectric material to establish a direct resistive electrical connection between the portion of the gate conductor structure and an adjacent source/drain conductor structure, thereby converting the capacitor into a resistor.

According to some embodiments, the dielectric antifuse structure and IC devices incorporating the dielectric antifuse structure, by utilizing a less robust dielectric material relative to a gate dielectric, allows the size of the programming circuitry, the magnitude of the current, and/or the programming voltage to be reduced significantly relative to other one transistor one resistor (1T1R) fuse designs. Although the dielectric antifuse is considered an antifuse, i.e., programming a dielectric antifuse structure creates an electrical connection, in some instances the term "fuse" will be used for simplicity. In some embodiments, for instance, the dielectric antifuse structure consumes 10% or less of the area of the programming circuitry when compared with the area used in implementing fuse designs, thereby allowing for the addition of more functional circuitry and/or a reduction in the size of the resulting IC device.

FIG. 1A is a schematic view of an as-manufactured IC structure according to some embodiments, specifically an IC structure having a dielectric antifuse structure 100. The dielectric antifuse structure 100 includes an antifuse element 112, which is configured as a capacitor with a first plate defined by a first portion of a source/drain conductor structure 108 electrically connected to the programming transistor 104, a second plate defined by a first portion of a gate conductor structure 106 that is electrically connected to a VDDQ supply and overlaps the first portion of a source/drain conductor structure 108, with a capacitor dielectric 107 (ILD) between the two plates of the fuse element 112. In some embodiments, the programming transistor 104 is configured with the gate conductor structure 104g being controlled by a word line 102w (WL) the source region 104s opposite the fuse element 112 being connected to a bit line (BL) 102b. The fuse element 112 is arranged between and connected to both the programming transistor 104 and a VDDQ supply from which the read voltage ($VDDQ_O$) and the higher programming voltage ($VDDQ_P$) are applied.

Figure 1B:
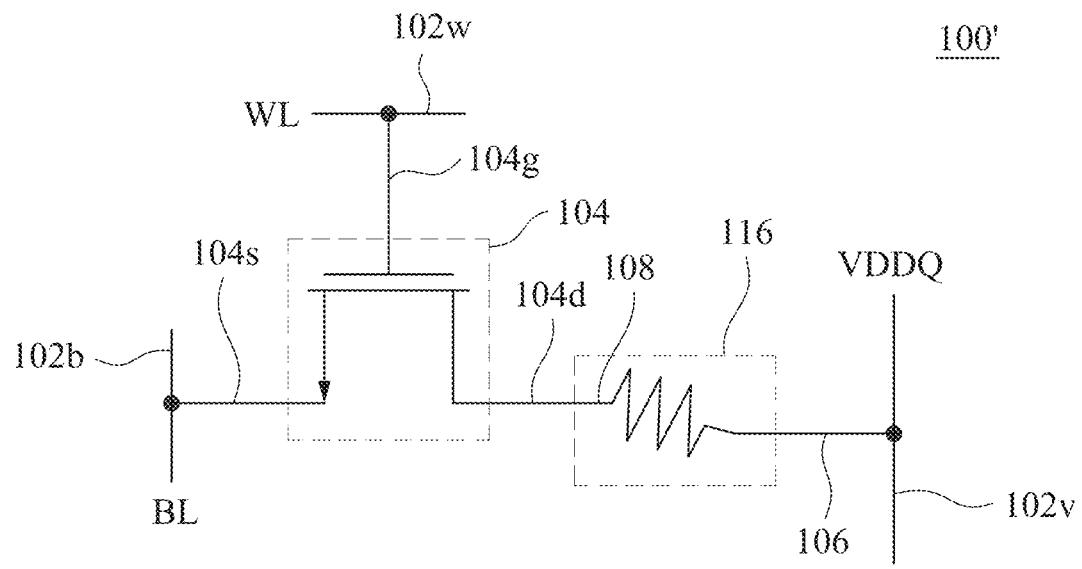

FIG. 1B is a schematic view of a programmed IC structure according to some embodiments, specifically an IC structure having a dielectric antifuse structure 100'. As programmed, the fuse element 112 provided in the dielectric antifuse structure 100 (FIG. 1A) has been subjected to a voltage level ($VDDQ_P$) sufficient to induce a breakdown in the portion of the capacitor dielectric 107 arranged between the overlapping portions of the first plate defined by the first portion of the source/drain conductor structure 108 (MD) and the second plate defined by a first portion of a gate conductor structure 106 (MG), thereby creating a resistive direct electrical connection 116 between the two plates of the original capacitor of fuse element 112.

Figure 2:
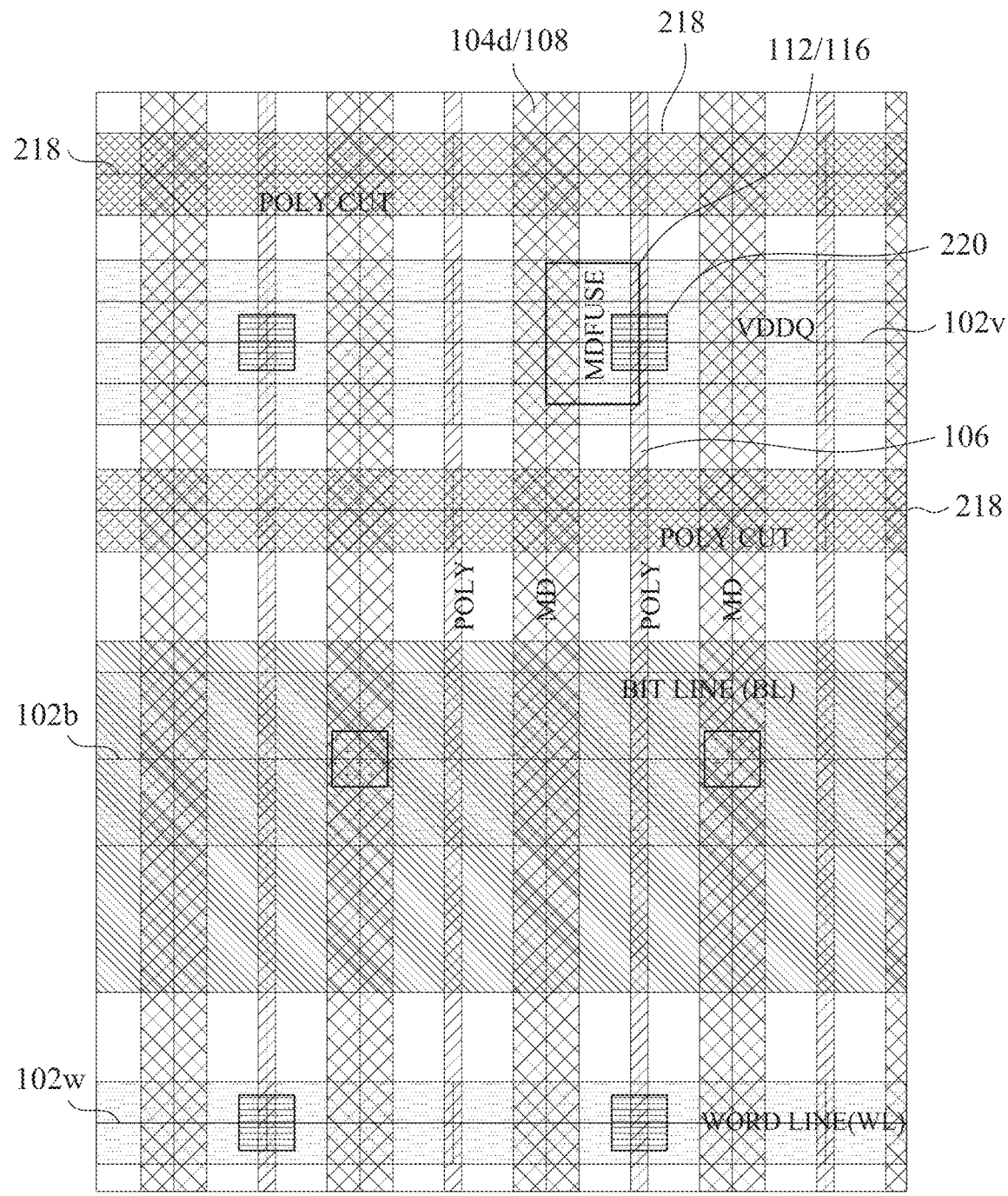
FIG. 2 is a layout view of an antifuse structure according to some embodiments corresponding to functional elements of an antifuse structure according to FIG. 1A.

FIG. 2 is a plan view of an IC structure design according to some embodiments of a dielectric antifuse structure. The dielectric antifuse structure includes a fuse element 112, which, as manufactured, is configured as a capacitor with a first plate defined by a first portion of a source/drain conductor structure 108, a second plate defined by a first portion of a gate conductor structure 106 and an interlayer dielectric (ILD) material provided between the two plates of the fuse element 112 as a capacitor dielectric 107 or, if programmed, a resistive direct electrical connection 116. In some embodiments, the programming transistor 104 is configured with the gate conductor structure 104g being controlled by a word line 102w (WL). The fuse element 112 is arranged between, and electrically connected to, both the programming transistor 104 and a VDDQ power supply 208 for a programming voltage 102v ($VDDQ_P$) from which the operational (read) voltages ($VDDQ_O$ or VDD) and programming voltage(s) ($VDDQ_P$) are supplied to the fuse element 112 and the programming transistor 104.

Figure 3B:
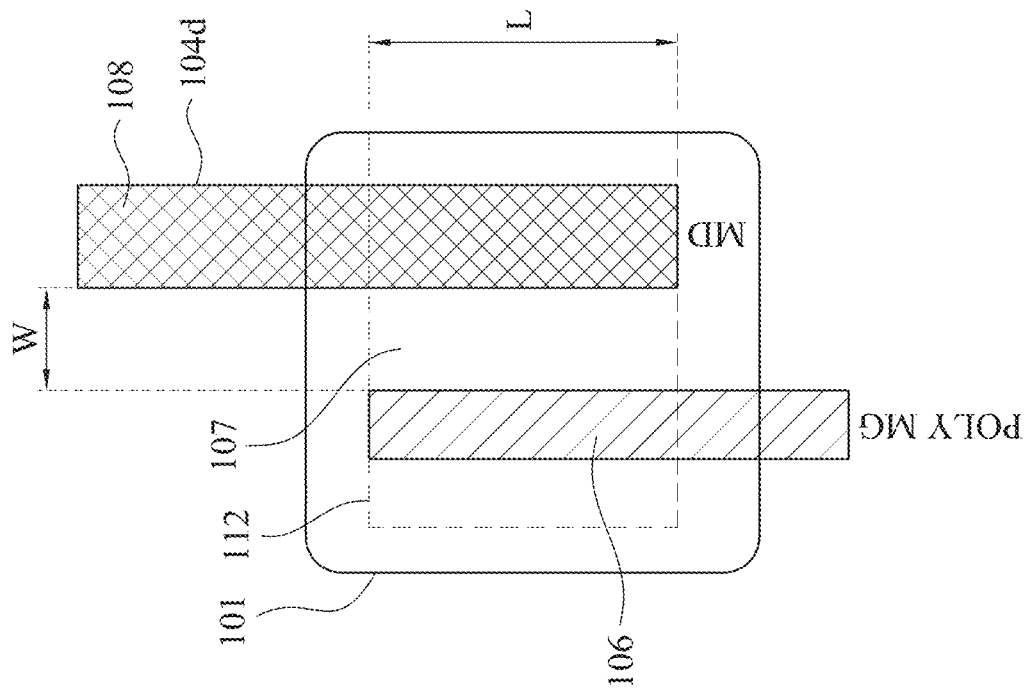
FIG. 3B is a layout view of a horizontal antifuse structure according to some embodiments.
Figure 3A:
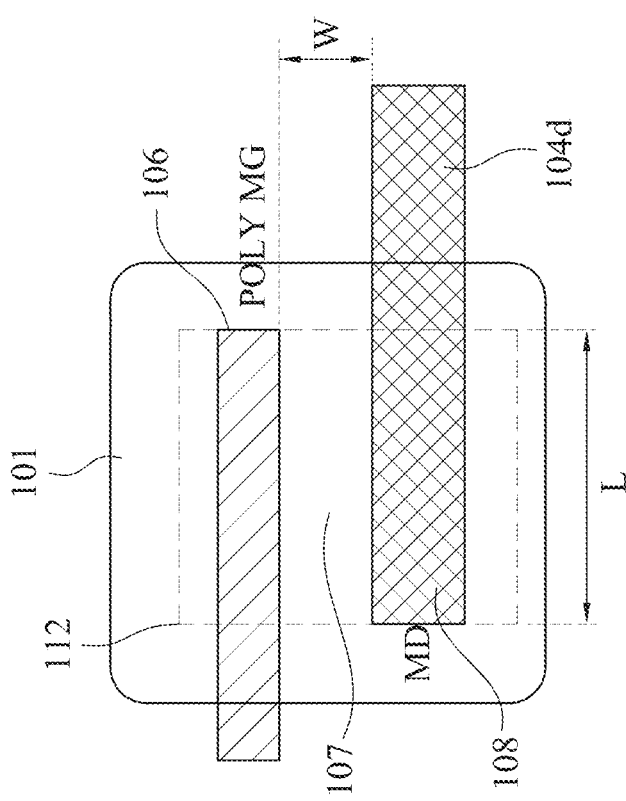
FIG. 3A is a layout view of a vertical antifuse structure according to some embodiments.

FIGS. 3A and 3B are plan views of fuse elements 112 according to some embodiments, which, as manufactured, are configured as a capacitor with a first plate defined by a first portion of a source/drain conductor structure 108 (MD), a second plate defined by a first portion of a gate conductor structure 106 and a portion of ILD material provided between the overlapping lengths of the two plates of fuse element 112 as a capacitor dielectric 107 or, if programmed, a resistor. Depending on the design specifications of the IC device, the design rules applicable to the design layout of the IC device, and the space available, the fuse elements 112 can be provided in a horizontal configuration, FIG. 3A, a vertical configuration, FIG. 3B, or other any other configuration consistent with the design rules.

In embodiments in which the fuse element 112 has been programmed, the resistance of the resulting connection is a function of the conductivity of the density of electrical connections established through the ILD material, the spacing W between the source/drain conductor structure 108 and the gate conductor structure 106 and the length L of the overlapping portions of the source/drain conductor structure 108 and the gate conductor structure 106.

Figure 3C:
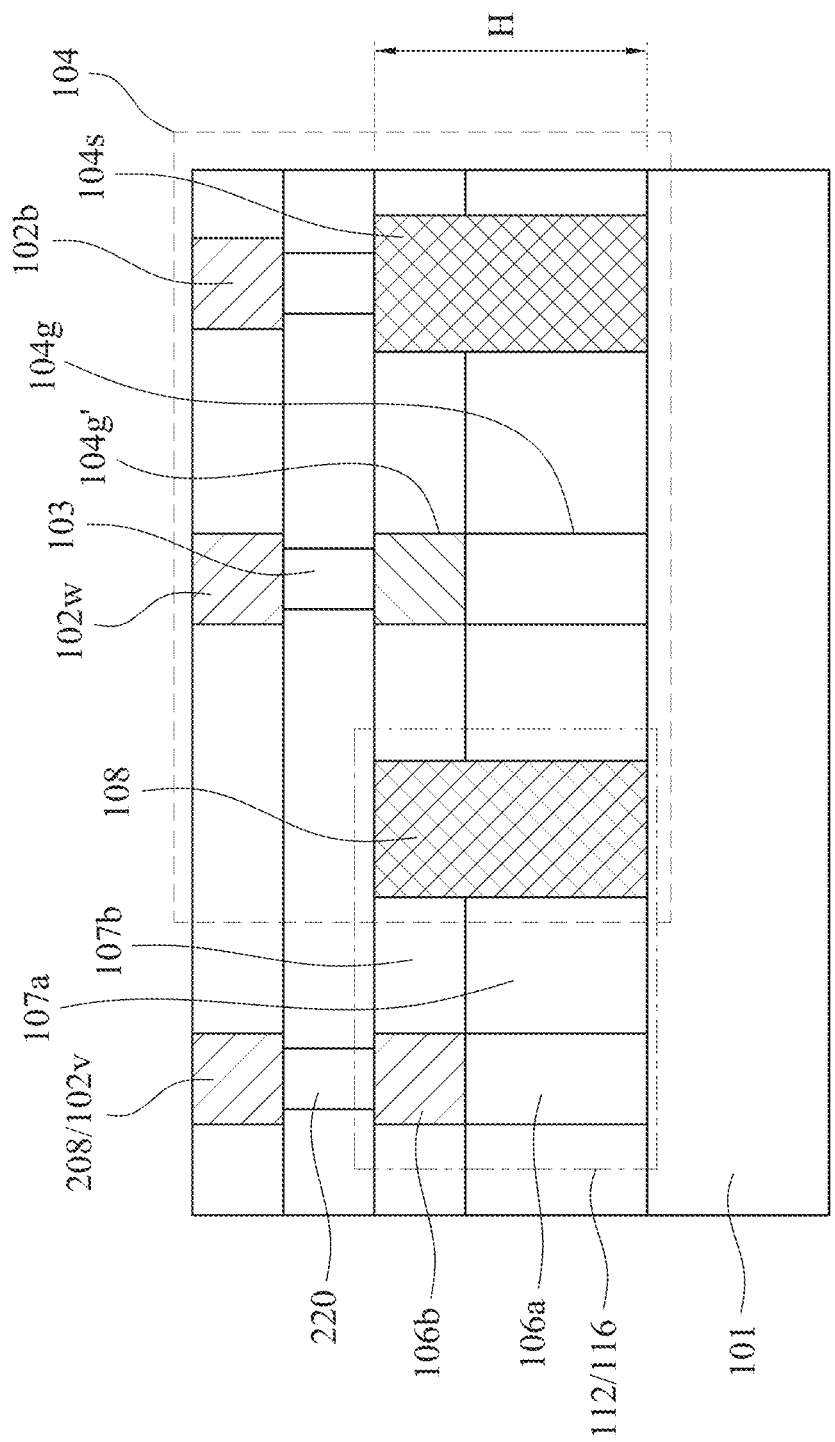
FIG. 3C is a cross-sectional view of an antifuse structure according to some embodiments.

FIG. 3C is a cross-sectional view of fuse element 112 and programming transistor 104 according to some embodiments, which, as manufactured over an active area 101 (the area in which the transistors are formed) or a field region (not shown), are configured as a capacitor with a first plate defined by a first portion of source/drain conductor structure 108, a second plate defined by first portion of a gate conductor structure 106, which can include multiple layers 106a, 106b of conductive material(s) (polysilicon, silicide, salicide, etc.), and portion(s) of ILD material provided between the overlapping lengths of the source/drain conductor structure 108 and gate conductor structure 106 plates of antifuse element 112 as a capacitor dielectric 107. Like the gate conductor structure 106, in some embodiments, the capacitor dielectric 107 includes more than one layer of material forming the capacitor dielectric 107a, 107b, having a combined height H or, if programmed, a resistive direct electrical connection 116 in programmed antifuse element 112. In some embodiments, the composition of the capacitor dielectric 107 used in a first antifuse element and the composition of the dielectric material used in a second antifuse element can be different, thereby allowing an IC designer greater flexibility regarding the performance of the antifuse elements in different regions of an IC device.

The length of the first portion of the gate conductor structure 106 is defined by the placement of poly cut lines 218 that serve to separate the first portion of the gate conductor structure 106 from the remainder of a polysilicon pattern. The first portion of the gate conductor structure 106 is, in turn, electrically connected to the VDDQ power supply 208 through via 220. In some embodiments, the programming transistor 104 includes a corresponding multilayer gate conductor structure 104g, 104g', and source/drain conductor structures 104d, 104s arranged on opposite sides of the gate conductor structure 106. The gate conductor structure 104g, 104g' of the programming transistor 104 is, in turn, electrically connected to a word line 102w (WL) through via 103. In some embodiments, the gate conductor structure is formed by depositing a metallic seed material on exposed surfaces of the active area and/or field regions with one or more layers of conductive material(s) being formed or deposited over the seed layer. In some embodiments, portions of the conductive material(s) are removed by chemical mechanical polishing (CMP) and/or plasma etching to isolate portions of the conductive material and form a conductive pattern. In some embodiments, upper portions of the gate conductor structures are treated to form silicide or salicide regions for further reducing the resistance of the gate conductor structures. In some embodiments, the source/drain conductor structures are formed by depositing or forming n-doped and/or p-doped silicon or polysilicon on opposite sides of the gate conductor structures.

Figure 4A:
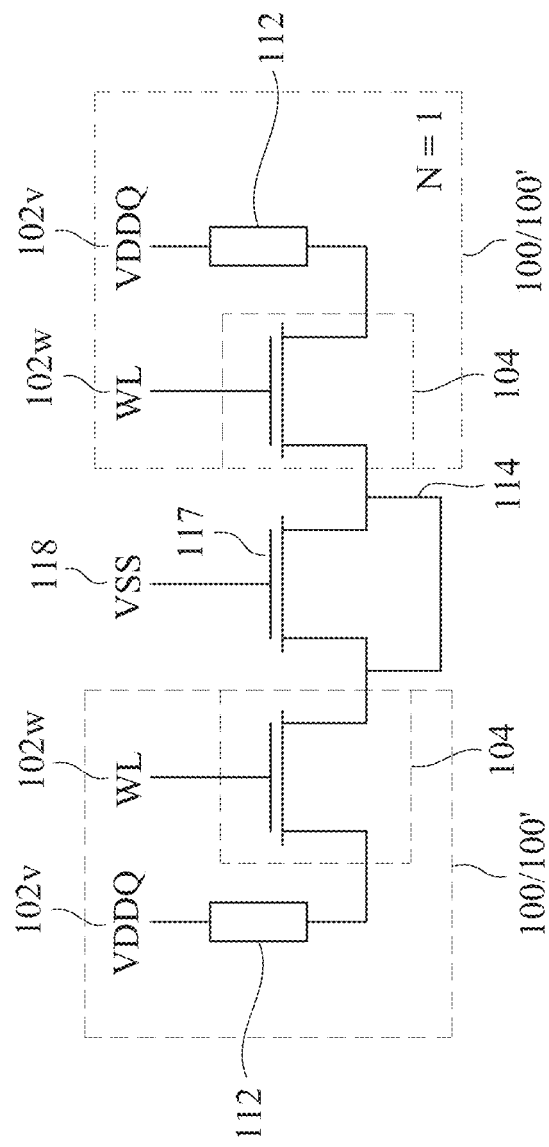
FIGS. 4A-4B are schematic views of IC devices incorporating an antifuse structure according to some embodiments.
Figure 4B:
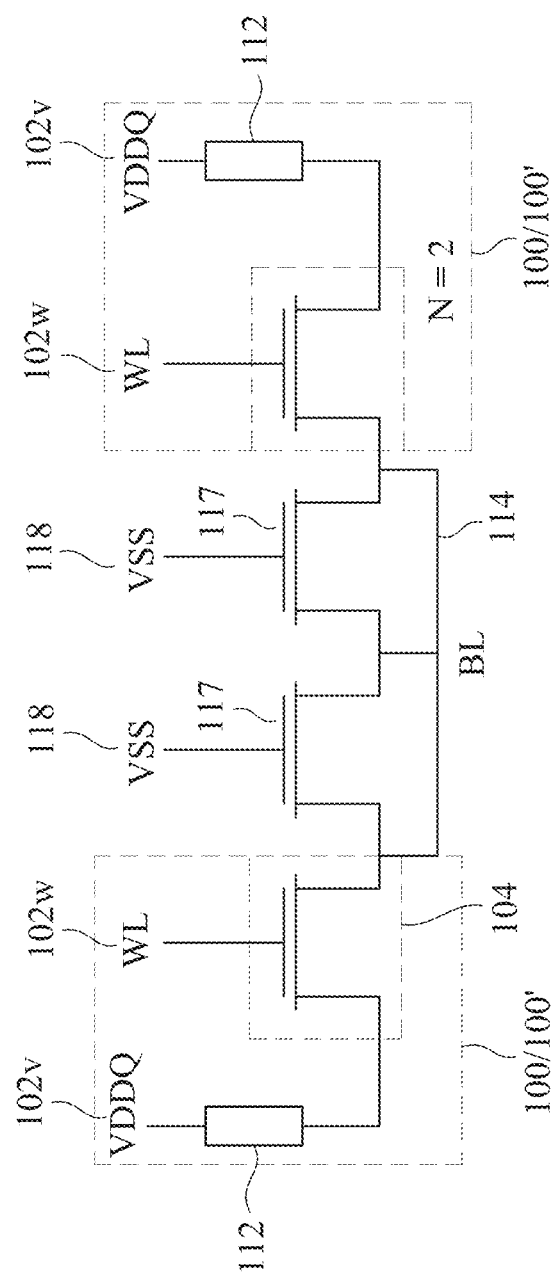

FIGS. 4A and 4B are schematic views of an IC structure according to some embodiments, specifically an IC structure having at least two dielectric antifuse structures 100/100' (unprogrammed/programmed) including both an antifuse element 112 and a programming transistor 104, with one or more dummy transistors 117 arranged between the dielectric antifuse structures 100/100'. In some embodiments, the dummy transistors are configured with the gate electrodes electrically connected to a "source" voltage 118 (VSS). The number of dummy transistors 117 is represented by a value "N," with N=1 for the schematic in FIG. 4A and N=2 for the schematic in FIG. 4B. Designs with higher N values are generally less efficient as a result of the amount of surface area dedicated for the programming circuitry that is not then available for building other functional elements. Accordingly, N values greater than 2 or 3 are possible, but have reduced efficiency.

Figure 5A:
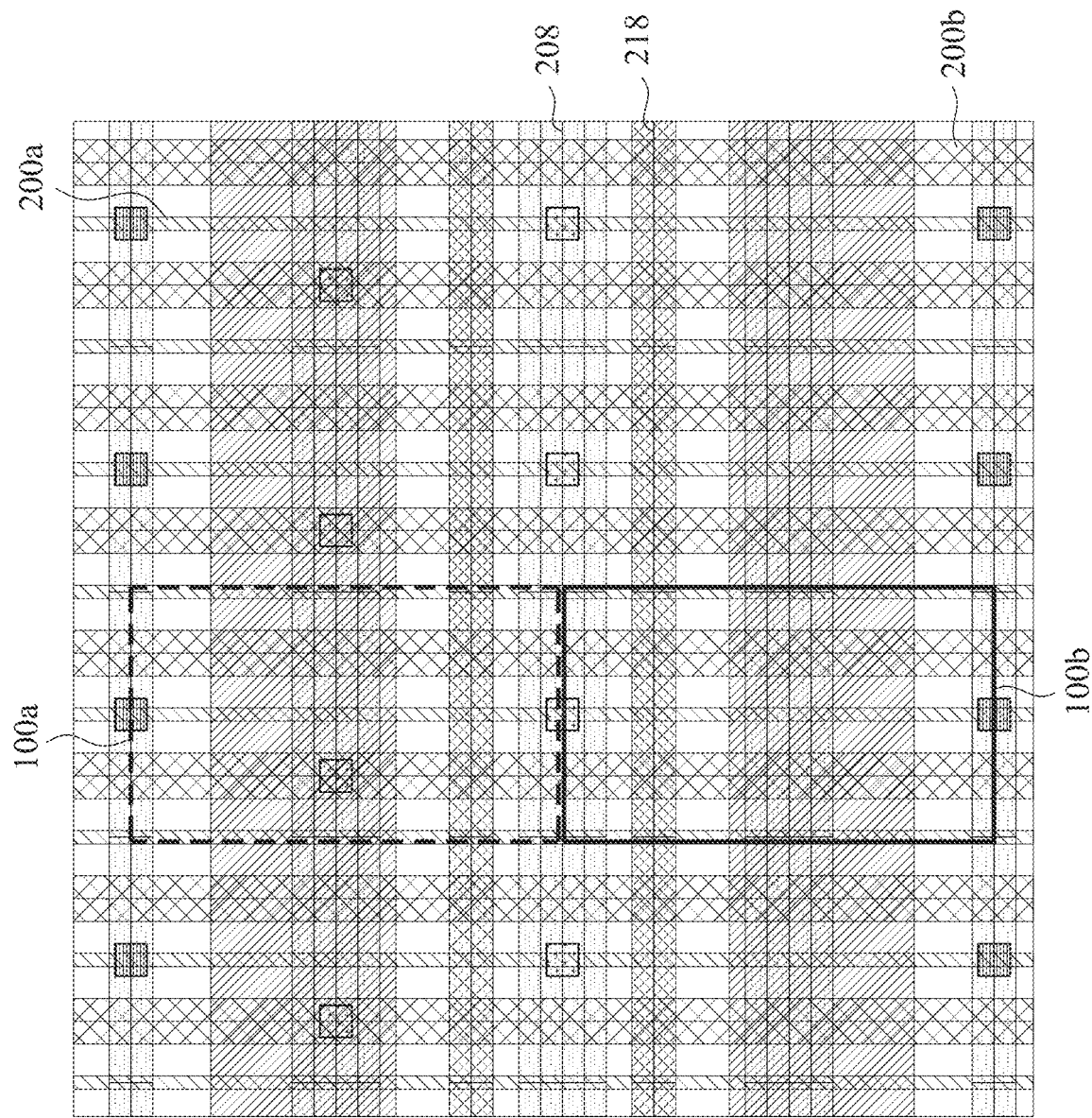
FIGS. 5A and 6A are layout views of IC devices incorporating a plurality of antifuse structures according to some embodiments and FIGS. 5B, 5C, and 6B are simplified layout views of the IC devices of FIGS. 5A and 6A.
Figure 5C:
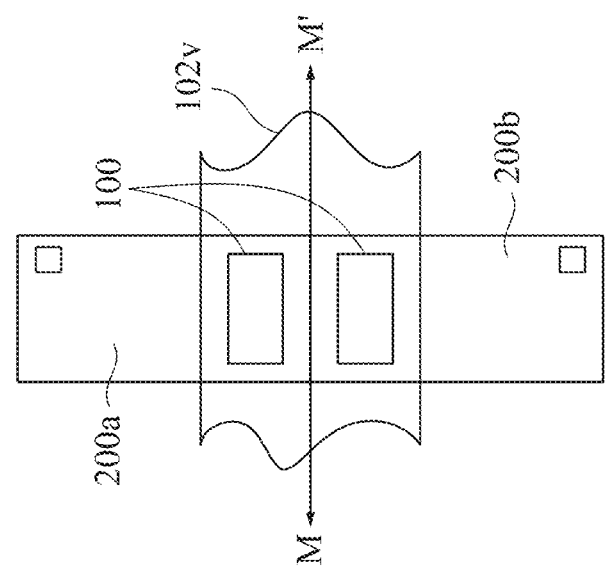
Figure 5B:
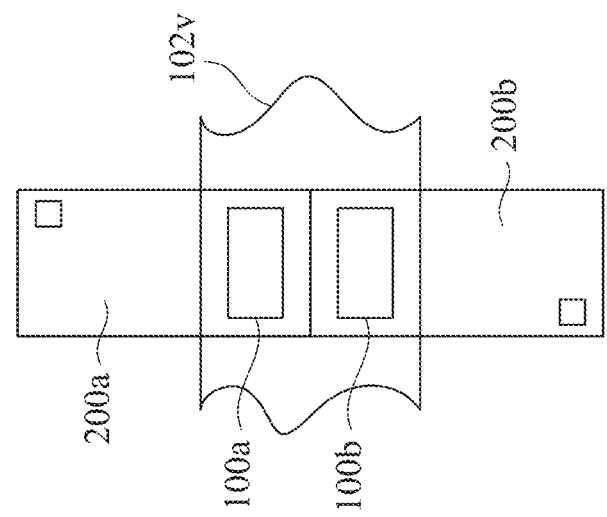

FIG. 5A is a plan view of an IC structure design according to some embodiments of an IC device that includes a pair of dielectric antifuse structures 100a, 100b that share a common boundary or edge along one side of the dielectric antifuse structures, in which dielectric antifuse structure 100a and dielectric antifuse structure 100b are offset from each other by an 180° rotation and share a common VDDQ power supply 208 extending parallel with the adjacent sides of the dielectric antifuse structures. FIGS. 5B and 5C are simplified plan views of an IC structure design according to some embodiments of an IC device highlighting the spatial relationship between pairs of adjacent IC devices 200a, 200b, according to some embodiments.

In FIG. 5B, IC device 200b is rotated 180° relative to IC device 200a and abuts IC device 200a along a minor edge of the IC devices 200a, 200b each of which includes a corresponding dielectric antifuse structure 100a, 100b. In FIG. 5C, IC device 200b is "mirrored" about axis M-M' relative to IC device 200a and abuts IC device 200a along a minor (shorter) edge of the IC devices 200a, 200b each of which includes a dielectric antifuse structure 100a, 100b.

Figure 6B:
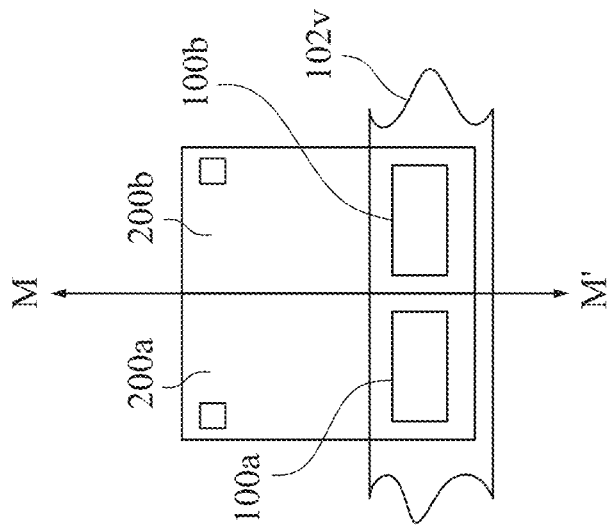
Figure 6A:
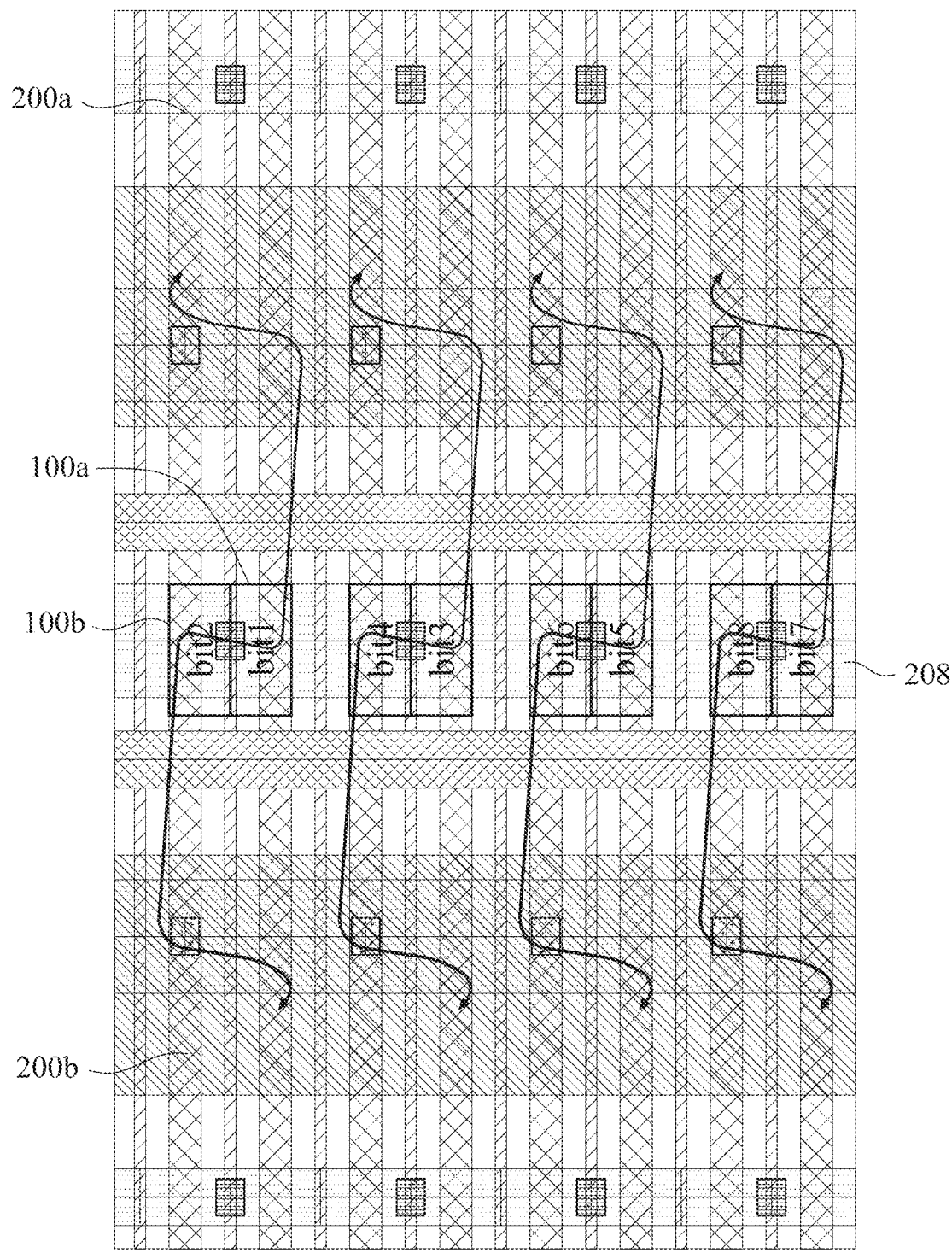

FIG. 6A is a plan view of an IC structure design according to some embodiments of an IC device that includes four pairs of dielectric antifuse structures 100a, 100b with one of the pair of dielectric antifuse structures 100a configured for programing circuitry directed to odd bits (bits 1, 3, 5, and 7) and the paired dielectric antifuse structures 100b configured for programing circuitry directed to even bits (bits 2, 4, 6, and 8). Each of the pairs of dielectric antifuse structures 100a, 100b share a common boundary or edge along a major (longer) side of the dielectric antifuse structure, in which dielectric antifuse structure 100a and dielectric antifuse structure 100b are rotationally offset from the paired dielectric antifuse structure 100a, 100b by 1800 or, alternatively, present a mirror image of the paired dielectric antifuse structure, and share a common VDDQ power supply 208 that extends over at least a portion of each of the dielectric antifuse structures 100a, 100b. In FIG. 6B, IC device 200b is "mirrored" about axis M-M' relative to IC device 200a and abuts IC device 200a along a major (longer) edge of the IC devices 200a, 200b, each of which includes a dielectric antifuse structure 100a, 100b.

Figure 7A:
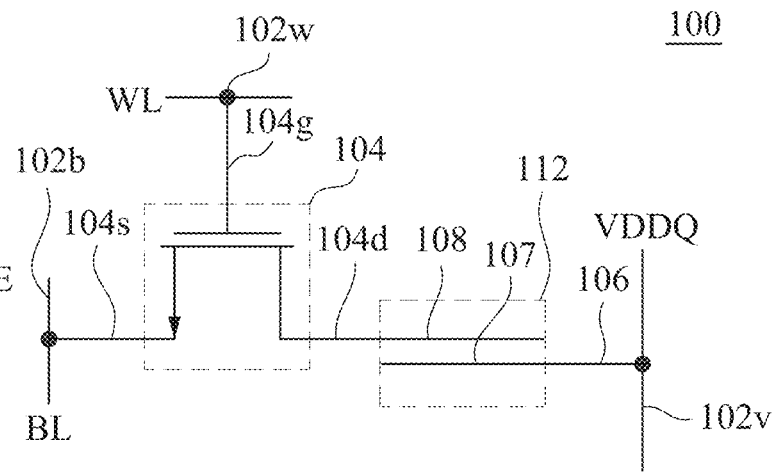
FIGS. 7A-7C are schematic views of the programming and read operations of an antifuse structure according to some embodiments.

FIG. 7A is a schematic view of an as-manufactured IC structure according to some embodiments, specifically an IC structure having a dielectric antifuse structure 100. During a programming operation, a programming sequence calculated to achieve the predetermined functionality of the final IC device is applied to the as-manufactured IC structure by connecting selected functional circuitry through corresponding dielectric antifuse structures. The programming sequence determines which of the initially "open" fuse elements 112 will be exposed to a programming voltage (VDDQ$_P$) under conditions suitable for degrading the dielectric material(s) in the fuse element 112 and creating resistive direct electrical connection 116. At the completion of the programming operation, i.e., when all of the selected dielectric antifuse structures have been programmed and are functioning as resistors, the programmed IC device will have the predetermined functionality and be ready for test and assembly operations.

Figure 7B:
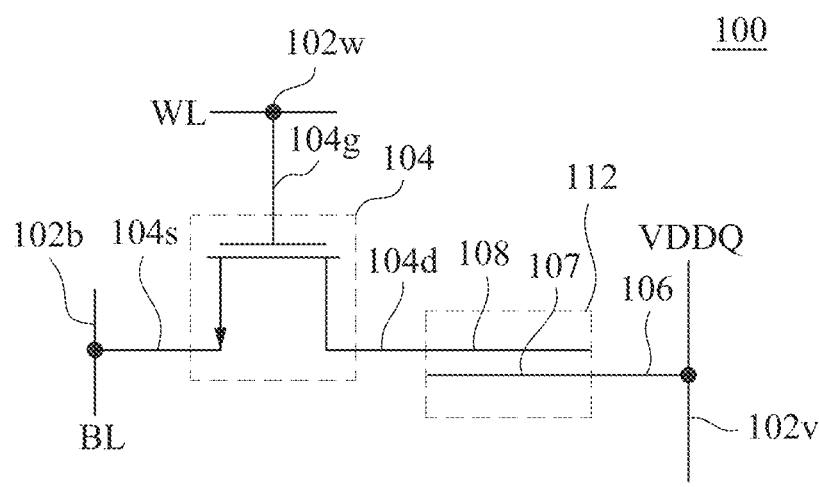

FIG. 7B is a schematic view of an as manufactured (and unprogrammed) IC structure according to some embodiments, specifically an IC structure in which the dielectric antifuse structure 100 was not exposed to a programming voltage (VDDQ$_P$) during the programming operation. Because the initial fuse element 112 capacitor structure remains intact, during a "READ" operation, the unprogrammed circuit will read as "open," i.e., will exhibit a negligible read current, and will be designated or read as a "0."

Figure 7C:
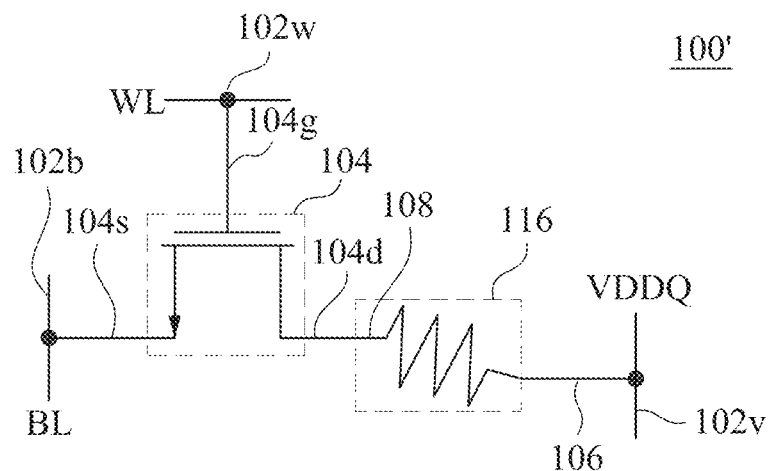

FIG. 7C is a schematic view of a programmed IC structure according to some embodiments, specifically an IC structure in which the programmed dielectric antifuse structure 100' was exposed to a programming voltage (VDDQ$_P$) under conditions suitable for degrading the dielectric material(s) found in the fuse element 112, the initial capacitor structure now resembles a resistive direct electrical connection 116. Because the initial capacitor structure was degraded (suffered a breakdown) during the programming operation, during a "READ" operation, the programmed circuit will read as a resistor, i.e., will exhibit a measureable read current, and will be designated or read as a "1".

Figure 8:
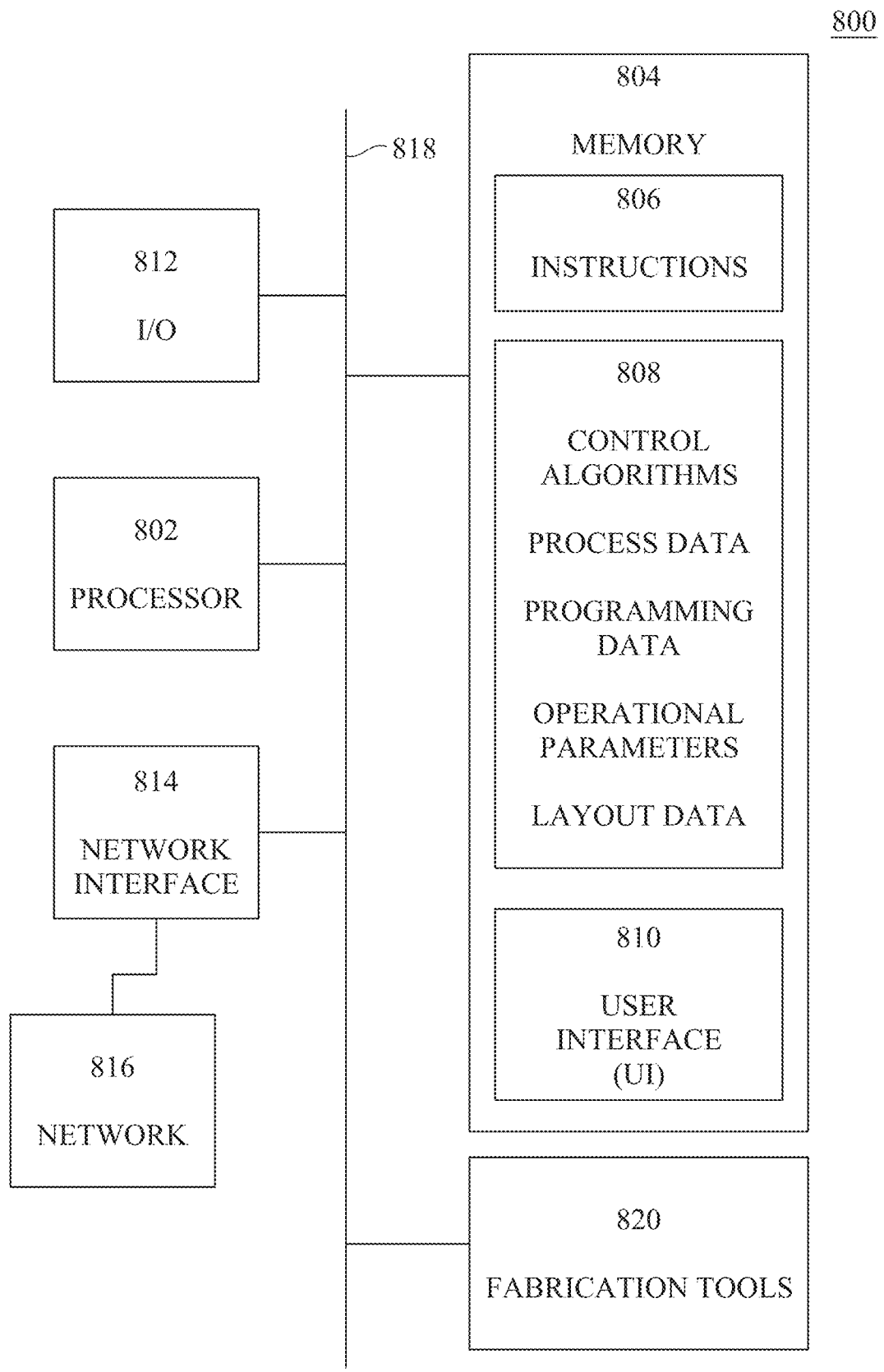
FIG. 8 is a chart reflecting functional portions of a system for manufacturing IC devices incorporating the antifuse structure.

FIG. 8 is a block diagram of an electronic process control (EPC) system 800, in accordance with some embodiments. Methods described herein of generating cell layout diagrams, in accordance with one or more embodiments, are implementable, for example, using EPC system 800, in accordance with some embodiments. In some embodiments, EPC system 800 is a general purpose computing device including a hardware processor 802 and a non-transitory, computer-readable, storage medium 804. Computer-readable storage medium 804, amongst other things, is encoded with, i.e., stores, computer program code (or instructions) 806, i.e., a set of executable instructions. Execution of computer program code 806 by hardware processor 802 represents (at least in part) an EPC tool which implements a portion or all of, e.g., the methods described herein in accordance with one or more (hereinafter, the noted processes and/or methods).

Hardware processor 802 is electrically coupled to computer-readable storage medium 804 via a bus 818. Hardware processor 802 is also electrically coupled to an I/O interface 812 by bus 818. A network interface 814 is also electrically connected to hardware processor 802 via bus 818. Network interface 814 is connected to a network 816, so that hardware processor 802 and computer-readable storage medium 804 are capable of connecting to external elements via network 816. Hardware processor 802 is configured to execute computer program code 806 encoded in computer-readable storage medium 804 in order to cause EPC system 800 to be usable for performing a portion or all of the noted processes and/or methods. In one or more embodiments, hardware processor 802 is a central processing unit (CPU), a multi-processor, a distributed processing system, an application specific integrated circuit (ASIC), and/or a suitable processing unit.

In one or more embodiments, computer-readable storage medium 804 is an electronic, magnetic, optical, electromagnetic, infrared, and/or a semiconductor system (or apparatus or device). For example, computer-readable storage medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 804 includes a compact disk-read only memory (CD-ROM), a compact disk-read/write (CD-R/W), and/or a digital video disc (DVD).

In one or more embodiments, computer-readable storage medium 804 stores computer program code 806 configured to cause the EPC system 800 (where such execution represents (at least in part) the EPC tool) to be usable for performing a portion or all of the noted processes and/or methods. In one or more embodiments, computer-readable storage medium 804 also stores information which facilitates performing a portion or all of the noted processes and/or methods. In one or more embodiments, computer-readable storage medium 804 stores process control data 808 including, in some embodiments, control algorithms, process variables and constants, target ranges, set points, programming control data, and code for enabling statistical process control (SPC) and/or model predictive control (MPC) based control of the various processes.

EPC system 800 includes I/O interface 812. I/O interface 812 is coupled to external circuitry. In one or more embodiments, I/O interface 812 includes a keyboard, keypad, mouse, trackball, trackpad, touchscreen, and/or cursor direction keys for communicating information and commands to hardware processor 802.

EPC system 800 also includes network interface 814 coupled to hardware processor 802. Network interface 814 allows EPC system 800 to communicate with network 816, to which one or more other computer systems are connected. Network interface 814 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 800.

EPC system 800 is configured to receive information through I/O interface 812. The information received through I/O interface 812 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 802. The information is transferred to hardware processor 802 via bus 818. EPC system 800 is configured to receive information related to a user interface (UI) through I/O interface 812. The information is stored in computer-readable medium 804 as user interface (UI) 810.

EPC system 800 is configured to send information to and receive information from fabrication tools 820 that include one or more of ion implant tools, etching tools, coating tools, rinsing tools, cleaning tools, chemical-mechanical planarizing tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution and progress of the manufacturing process. The information is stored in and/or retrieved from computer-readable medium 804.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 800.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
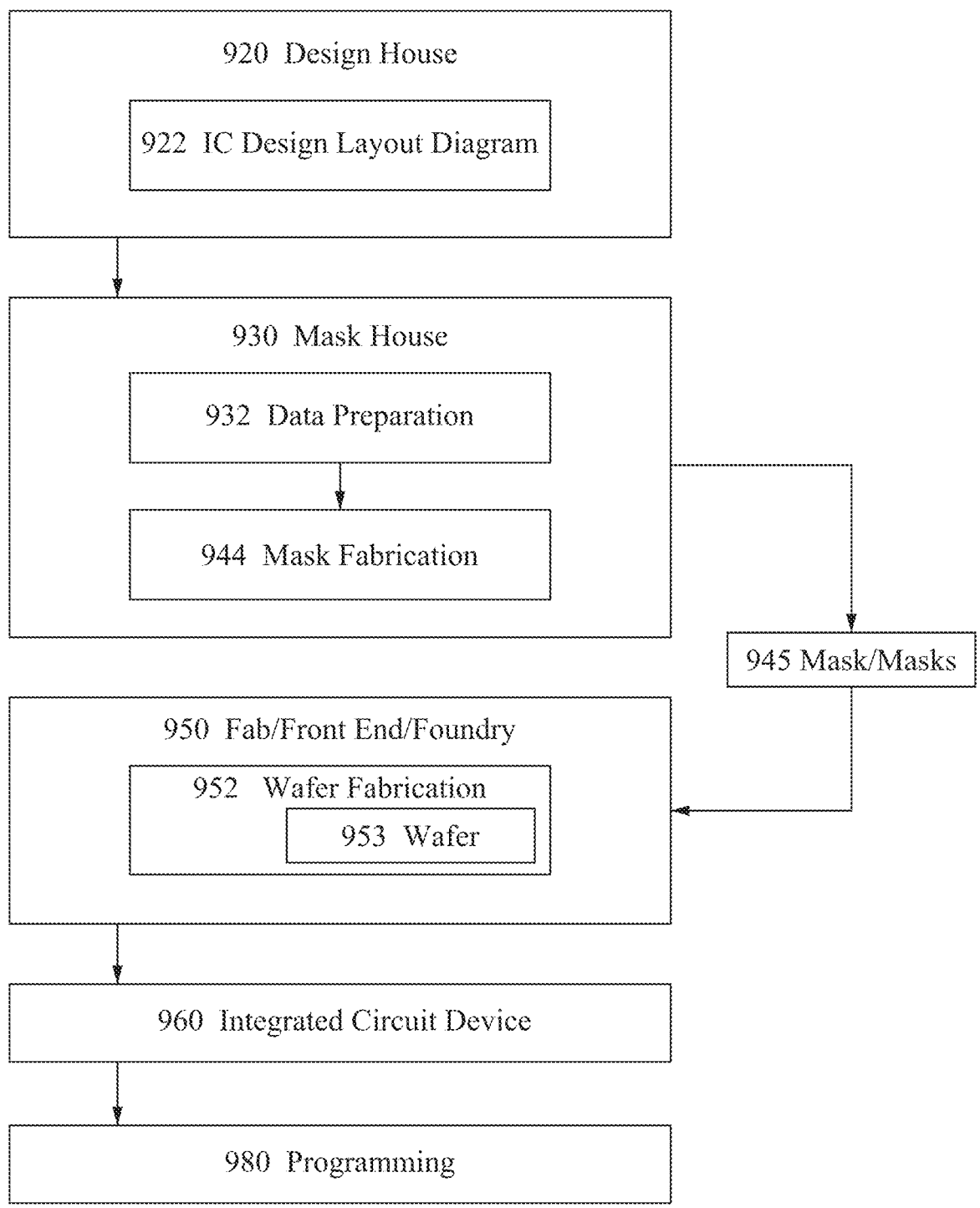
FIG. 9 is a flowchart showing the overlap between IC device design, manufacture, and programming.

FIG. 9 is a block diagram of an integrated circuit (IC) manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in manufacturing system 900 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 920, mask house 930, and IC Fab 950 is owned by a single larger company. In some embodiments, two or more of design house 920, mask house 930, and IC Fab 950 coexist in a common facility and use common resources.

Design house (or design team) 920 generates an IC design layout diagram 922. IC design layout diagram 922 includes various geometrical patterns designed for an IC device 960. The geometrical patterns correspond to patterns of metal, oxide, or semiconductor layers that make up the various components of IC device 960 to be fabricated. The various layers combine to form various IC features.

For example, a portion of IC design layout diagram 922 includes various IC features, such as an active area, gate electrode, source and drain regions, metal lines or contacts/vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place and route. IC design layout diagram 922 is presented in one or more data files having information of the geometrical patterns. For example, IC design layout diagram 922 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 930 includes mask data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The IC design layout diagram 922 is manipulated by mask data preparation 932 to comply with particular characteristics of the mask writer and/or requirements of IC Fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC Fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are repeated to further refine IC design layout diagram 922.

It should be understood that the above description of mask data preparation 932 has been simplified for the purposes of clarity. In some embodiments, mask data preparation 932 includes additional features such as a logic operation (LOP) to modify the IC design layout diagram 922 according to manufacturing rules. Additionally, the processes applied to IC design layout diagram 922 during mask data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask.

In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC Fab 950 includes wafer fabrication 952. IC Fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 952 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 945 include a single layer of mask material. In some embodiments, a mask 945 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC Fab 950 uses mask(s) 945 fabricated by mask house 930 to fabricate IC device 960. Thus, IC Fab 950 at least indirectly uses IC design layout diagram 922 to fabricate IC device 960. In some embodiments, semiconductor wafer 953 is fabricated by IC Fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multi-level interconnects, and the like (formed at subsequent manufacturing steps).

Once manufactured, however, IC device 960 designs that include efuse and/or antifuse structures will typically be subjected to a programming operation 980. During a programming operation, the IC design layout diagram 922 is used to develop a programming sequence during which a programming voltage ($VDDQ_P$) in excess of the designed operating and/or input/output voltages (VDDQ, VDD) is applied to designated dielectric antifuses, causing the dielectric layer in the antifuse element 112 to breakdown and form a resistive direct electrical connection 116 as shown in, e.g., FIGS. 1B and 7C, for some embodiments.

For example, programmable read-only memory (PROM) devices have a grid of columns and separated from a corresponding grid of rows in which every column/row intersection (cell) includes an efuse connecting the two grids. A charge sent through a column will pass through an intact efuse to a grounded row indicating a value of 1 for that particular cell. Because each of the cells has an efuse, the initial (blank) state of a PROM chip is all 1s. To change the value of a designated cell to 0, a programming device is used to send a specified programming current through the cell.

The programming current is sufficient to break the electrical connection between the column and row of the designated cell by "burning out" the efuse in an operation frequently referred to as "burning" the PROM.

The efuse approach noted above in connection with PROM does not, however, scale well into deep submicron and/or FinFET processes, and such efuse structures consume a lot of device area to build the transistors used in larger-capacity one-time programmable (OTP) non-volatile memory devices (NVM). In some embodiments, devices utilizing the efuse approach suffer from high leakage currents in standby mode. And just as forced electromigration (EM) during the programming operation can "open" a metallic fuse, in some instances EM associated with the subsequent operation of the programmed device causes efuses to reform an electrical connection, thereby corrupting the information initially programmed into the NVM. These drawbacks have caused designers and foundries to look for alternatives.

The dielectric antifuse utilized in some embodiments, like other antifuse-based OTP NVMs utilize differential oxide breakdown performance to create its programming element and can be incorporated into standard CMOS processes and device designs without requiring additional process steps. In some embodiments, the antifuse elements also follow the same electrical and layout design rules as standard logic circuits and is, therefore, scalable along with the other functional structures comprising an IC device. The antifuse elements, therefore, benefit from the same yield and reliability gains as other functional elements manufactured in accord with the improved performance provided by maturing process nodes while being readily adaptable for the most aggressive new process nodes.

Some antifuse OTP devices works by exploiting the parametric differences between a thinner gate/core oxide and the thicker I/O oxide available in standard CMOS processes. The antifuse devices are programmed by applying a high voltage to the gate, which causes the thinner core oxide to break down and create a short circuit. This process is robust and reliable, and unlike efuses, the oxide breakdown used to create the current path does not suffer from regrowth or reconstitution over time. According to some embodiments, a dielectric antifuse OTP IC device, however, works by exploiting the dielectric qualities of the capacitor dielectric(s) 107 (with the ILD materials being selected from, e.g., dielectrics, low-κ dielectrics, porous low-κ dielectrics, and combinations thereof) provided between a gate conductor structure 106, typically polysilicon and/or silicides/salicides, and an adjacent source/drain conductor structure 108.

Unlike some prior art antifuse structures, the dielectric antifuse structure 100 does not involve breaking down the gate oxide/dielectric layer(s). As a result of the ILD deposition techniques, the breakdown properties of the ILD material can be modified to some degree by changing the ILD material(s), the ILD deposition technique and/or conditions, and/or doping contained in the ILD material. Dielectric antifuse structures according to some embodiments are highly scalable and provide a degree of area efficiency significantly greater than that of conventional efuse structures. In some embodiments, the surface area used for the dielectric antifuse structure(s) is at least 90% less than the surface area that would be used for a corresponding efuse structure. The reduced area consumption of dielectric antifuse structures according to some embodiments allows for the manufacture of IC devices that use lower read power relative to IC devices utilizing conventional efuse structures to obtain the same IC device functionality.

Thus, IC Fab 950 at least indirectly uses IC design layout diagram 922 to fabricate IC device 960. In some embodiments, semiconductor wafer 953 is fabricated by IC Fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multilevel interconnects, and the like (formed at subsequent manufacturing steps).

In some embodiments, conductive lines are created within the integrated circuit by depositing a layer of dielectric material on a layer of the integrated circuit having gate structures therein, followed by forming an opening in the dielectric material at the location of at least one track. In some embodiments, metallic seed material is added to exposed surfaces within the opening in the dielectric material and a layer of conductive material is added to the opening over the seed layer. In some embodiments, the layer of conductive material is added by electroplating. In some embodiments, the layer of conductive material is added by sputtering, e.g., from a metal target. In some embodiments, the layer of conductive material is added by chemical vapor deposition, including one or more of chemical vapor deposition (CVD), plasma-enhanced chemical vapor deposition (PECVD), atomic layer deposition (ALD), and the like. In some embodiments, conductive material on top of the layer of dielectric material is removed from the top of the layer of dielectric material by chemical mechanical polishing (CMP) and/or plasma etching to isolate portions of the conductive material in the openings within the layer of dielectric material.

In some embodiments, the conductive lines along various tracks of the integrated circuit layout or manufactured integrated circuit are separated from each other, by removing a length of a conductive line between two other conductive lines, and filing the volume of the removed length of conductive line with dielectric material (e.g., making a trench isolation structure between two conductive lines, wherein the trench isolation structure and the conductive lines each extend along the first direction). In some embodiments, portions of one or more adjoining conductive lines are isolated by etching through the conductive lines to form an insolation structure that extends in a second direction different from the direction in which the conductive lines extend through the layer of the integrated circuit.

Active areas, or functional areas, or cells, of the integrated circuit device, are separated from each other or other elements of the integrated circuit by the trench isolation structure between portions of conductive lines in a region of the integrated circuit. In some embodiments, the conductive lines of the integrated circuit extend perpendicular to gate electrodes and the voltage-carrying or ground lines [VDD (primary drain voltage), $VDDQ_P$ (programming drain voltage), $VDDQ_O$ (operational I/O drain voltage), and VSS (source voltage)] of the cell of the IC device. In some embodiments, the conductive lines of the integrated circuit extend parallel to at least one of the voltage-carrying lines of the integrated circuit, and parallel to the gate electrodes of the cell of the integrated circuit.

Some embodiments include an integrated circuit having a first dielectric antifuse electrode over an active area, a second dielectric antifuse electrode over the active area and parallel to the first dielectric antifuse electrode, and a dielectric composition between the first dielectric antifuse electrode and the second dielectric antifuse electrode in which the first dielectric antifuse electrode, the second dielectric antifuse electrode, and the dielectric composition form a capacitor. Some other embodiments also include a programming transistor directly electrically connected to the second dielectric antifuse electrode and a word line electrode electrically connected to a gate electrode of the programming transistor. In some embodiments the dielectric composition is selected from a group consisting of low-κ dielectrics, porous low-κ dielectrics, and combinations thereof, the first dielectric antifuse electrode comprises a first portion of a polysilicon gate structure, and the second dielectric antifuse electrode comprises a first portion of a source/drain of the programming transistor. In some embodiments, the programming transistor is electrically connected to a bit line, with the gate electrode being arranged electrically between the bit line and the second dielectric antifuse electrode. In some embodiments, the dielectric composition will be characterized by a breakdown voltage that is less than a programming voltage.

Some embodiments include an integrated circuit structure having a first dielectric antifuse structure on an active area, the first dielectric antifuse structure including a first dielectric antifuse electrode, a second dielectric antifuse electrode extending parallel to the first dielectric antifuse electrode, a first dielectric composition between the first dielectric antifuse electrode and the second dielectric antifuse electrode, and a first programming transistor electrically connected to a first bit line electrode, a first word line electrode, and the second dielectric antifuse electrode and a second dielectric antifuse structure on the active area, the second dielectric antifuse structure including a third dielectric antifuse electrode, a fourth dielectric antifuse electrode extending parallel to the third dielectric antifuse electrode, a second dielectric composition between the third dielectric antifuse electrode and the fourth dielectric antifuse electrode, and a second programming transistor electrically connected to a second bit line electrode, a second word line electrode, and the fourth dielectric antifuse electrode. In some embodiments, the first dielectric antifuse electrode is connectible to a programming voltage, the programming voltage being sufficient to induce a breakdown in the first dielectric composition and form an electrical connection between the first dielectric antifuse electrode and the second dielectric antifuse electrode, and the third dielectric antifuse electrode is connectible to the programming voltage, the programming voltage being sufficient to induce a breakdown in second the dielectric composition and form an electrical connection between the third dielectric antifuse electrode and the fourth dielectric antifuse electrode. In some embodiments, a first dummy transistor is arranged between the first programming transistor and the second programming transistor and, in some other embodiments, a second dummy transistor is arranged adjacent the first dummy transistor. In some embodiments, the first bit line electrode and the second bit line electrode are combined in a common bit line electrode. In some embodiments, the first dielectric antifuse structure is rotated 180° relative to the second dielectric antifuse structure or the first dielectric antifuse structure is mirrored about an axis to define the second dielectric antifuse structure.

Some embodiments include a method for programming a semiconductor device including obtaining a semiconductor device having a number of integrated dielectric antifuse circuits, with each integrated dielectric antifuse circuit including a first dielectric antifuse electrode, a second dielectric antifuse electrode adjacent and parallel to the first dielectric antifuse electrode, a dielectric separating the first dielectric antifuse electrode and the second dielectric antifuse electrode to which a programming voltage is applied to a first set of integrated dielectric antifuse circuits, the programming voltage being sufficient to induce breakdown of the dielectric and thereby form a resistive direct electrical connection between the first dielectric antifuse electrode and the second dielectric antifuse electrode of each of the first set of integrated fuse circuits to obtain a programmed semiconductor device. In other embodiments, a first dielectric antifuse electrode is a first polysilicon structure formed on an active area and a second dielectric antifuse electrode is a second polysilicon structure formed on an active area adjacent and parallel to the first polysilicon structure. In other embodiments, a spacing distance between the first dielectric antifuse electrode and the second dielectric antifuse electrode meets or exceeds a minimum source/drain to gate electrode spacing defined by a set of design rules used in designing and/or manufacturing the other functional elements on the semiconductor device. In other embodiments, the first dielectric antifuse electrode is a source/drain contact structure and the second dielectric antifuse electrode is a gate electrode structure. In other embodiments, the method also includes conducting a functional test of the programmed semiconductor device. In other embodiments, the dielectric is an interlayer dielectric selected from a group consisting of dielectrics, low-κ dielectrics, porous low-κ dielectrics, and combinations thereof. In other embodiments, the second dielectric antifuse electrode is a source/drain contact structure of a programming transistor, the programming transistor being selected from a group consisting of NMOS transistors, PMOS transistors, and combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit comprising:
   a first dielectric antifuse electrode extending along a first axis;
   a second dielectric antifuse electrode extending along a second axis, wherein the first axis and second axis are parallel and are separated by a spacing W, and a section of the second dielectric antifuse electrode overlaps a section of the first dielectric antifuse electrode in an overlap region having a length L; and
   a dielectric composition between the first dielectric antifuse electrode and the second dielectric antifuse electrode in the overlap region.

2. The integrated circuit of claim 1, further comprising:
   a programming transistor is directly electrically connected to the second dielectric antifuse electrode; and
   a word line electrode electrically connected to a gate electrode of the programming transistor.

3. The integrated circuit of claim 2, wherein:
the first dielectric antifuse electrode comprises a first portion of a gate structure; and
the second dielectric antifuse electrode comprises a first portion of a source/drain of the programming transistor.

4. The integrated circuit of claim 3, wherein:
the programming transistor is electrically connected to a bit line, wherein the gate electrode is electrically between the bit line and the second dielectric antifuse electrode.

5. The integrated circuit of claim 2, wherein:
the dielectric composition has a breakdown voltage and the breakdown voltage is less than a programming voltage of the programing transistor.

6. The integrated circuit of claim 1, wherein:
the dielectric composition is selected from a group consisting of low-κ dielectrics, porous low-κ dielectrics, and combinations thereof.

7. An integrated circuit structure comprising:
an active area having a planar surface region; and
a first dielectric antifuse structure on the planar surface region;
wherein the first dielectric antifuse structure comprises:
a first dielectric antifuse electrode on the planar surface region,
a second dielectric antifuse electrode on the planar surface region and offset from the first dielectric antifuse electrode,
a first dielectric composition on the planar surface region and filling an opening between the first dielectric antifuse electrode and the second dielectric antifuse electrode, and
a first programming transistor electrically connected to a first bit line electrode, a first word line electrode, and the second dielectric antifuse electrode.

8. The integrated circuit structure according to claim 7, further comprising:
a first dummy transistor between the first programming transistor and a second programming transistor.

9. The integrated circuit structure according to claim 8, further comprising:
a second dummy transistor adjacent the first dummy transistor.

10. The integrated circuit structure according to claim 8, wherein:
the first bit line electrode and a second bit line electrode comprise a common bit line electrode.

11. The integrated circuit structure according to claim 7, wherein:
the first dielectric antifuse structure is rotated 180° relative to a second dielectric antifuse structure.

12. The integrated circuit structure according to claim 7, wherein:
the first dielectric antifuse structure is mirrored about an axis to define a second dielectric antifuse structure.

13. A semiconductor device comprising:
a plurality of integrated dielectric antifuse circuits, wherein each of the integrated dielectric antifuse circuits further comprises:
a first dielectric antifuse electrode;
a second dielectric antifuse electrode;
an overlap region wherein a portion of the first dielectric antifuse electrode is horizontally separated from a portion of the second dielectric antifuse electrode;
a first set of integrated dielectric antifuse circuits comprising a dielectric structure separating and insulating the first dielectric antifuse electrode from the second dielectric antifuse electrode in the overlap region;
a second set of integrated dielectric antifuse circuits comprising a degraded dielectric structure separating and providing a resistive contact between the first dielectric antifuse electrode and the second dielectric antifuse electrode in the overlap region; and
wherein the combination of the first set of integrated dielectric antifuse circuits and the second set of integrated dielectric antifuse circuits define a desired functionality of the semiconductor device.

14. The semiconductor device according to claim 13, further comprising:
a first conductive structure on an active area defining the first dielectric antifuse electrode; and
a second conductive structure on the active area defining the second dielectric antifuse electrode, wherein the second dielectric antifuse electrode is adjacent to and parallel to the first dielectric antifuse electrode.

15. The semiconductor device according to claim 13, further comprising:
arranging the first dielectric antifuse electrode and the second dielectric antifuse electrode to meet a minimum source/drain electrode to gate electrode spacing defined by a set of design rules used in designing the semiconductor device.

16. The semiconductor device according to claim 13, wherein:
the first dielectric antifuse electrode is electrically connected to a source/drain contact; and
the second dielectric antifuse electrode is electrically connected to a gate electrode structure.

17. The semiconductor device according to claim 13, wherein:
the desired functionality of the semiconductor device has been verified by a functional test.

18. The semiconductor device according to claim 13, wherein:
the dielectric structure between the first dielectric antifuse electrode and the second dielectric antifuse electrode comprises a portion of an interlayer dielectric structure.

19. The semiconductor device according to claim 18, wherein:
the dielectric structure is selected from the group consisting of dielectrics, low-κ dielectrics, porous low-κ dielectrics, and combinations thereof.

20. The semiconductor device according to claim 18, wherein:
the second dielectric antifuse electrode is electrically connected to a source/drain contact structure comprising a programming transistor selected from the group consisting of NMOS transistors, PMOS transistors, and combinations thereof.

* * * * *